(12) United States Patent
Lukanc et al.

(10) Patent No.: US 6,528,372 B2
(45) Date of Patent: Mar. 4, 2003

(54) SIDEWALL SPACER DEFINITION OF GATES

(75) Inventors: Todd P. Lukanc, San Jose, CA (US); Christopher F. Lyons, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/891,306

(22) Filed: Jun. 27, 2001

(65) Prior Publication Data

US 2003/0003751 A1 Jan. 2, 2003

(51) Int. Cl.$^7$ ............................................. H01L 21/336
(52) U.S. Cl. ........................................ 438/286; 438/696
(58) Field of Search ................................ 438/197, 286, 438/303, 584, 595, 694, 695, 696

(56) References Cited

U.S. PATENT DOCUMENTS 5,672,531 A * 9/1997 Gardner et al. ............. 438/286
5,923,982 A * 7/1999 Kadosh et al. ............. 438/286
5,936,874 A    8/1999 Clampitt et al.
6,043,562 A    3/2000 Keeth

* cited by examiner

Primary Examiner—Michael Sherry
Assistant Examiner—Lisa Kilday
(74) Attorney, Agent, or Firm—Foley & Lardner

(57) ABSTRACT

A method of forming features on a semiconductor device uses sidewall spacers, and includes providing a sidewall template having first and second sidewall regions. A spacer layer of a spacer material is formed over the sidewall template. The spacer layer is then etched in a first etch to remove a first region of the spacer layer over the first sidewall region while leaving a second region of the spacer layer over the second sidewall region. The spacer layer is again etched in a second etch to for at least one sidewall spacer.

29 Claims, 11 Drawing Sheets

SIDEWALL SPACER DEFINITION OF GATES

This application is related to application Ser. No. 09/482,256 entitled "SIDEWALL PATTERNING FOR SUB 100 NM GATE CONDUCTORS".

FIELD OF THE INVENTION

This invention relates generally to the definition of sub-lithographic structures through the formation of sidewall spacers. In particular, this invention relates to sidewall spacer definition of sub-lithographic structures in semiconductor device fabrication.

BACKGROUND OF THE INVENTION

A continuing trend in semiconductor devices is the reduction of feature size to decrease the distance between components on devices and thus increase device speed and computational power. Photolithographic processes used for forming features have addressed the reduction in size and lowered the critical dimension (CD) attainable in a device, at least in part, through the use of ever decreasing wavelengths of electromagnetic radiation, i.e., light, to expose feature patterns on photoresist.

One important feature whose size is often determined by the CD in a semiconductor device is the gate. A typical gate fabrication process is shown in FIGS. 1A–1D. In FIG. 1A, gate oxide 110 is formed on a semiconductor substrate 100 between field oxide regions 102. A gate material layer 112, such as polycrystalline silicon, i.e., polysilicon, is formed on the gate oxide 110 and over the field oxide regions 102.

In FIG. 1B, a photoresist mask 114 is formed on the gate material layer 112. The photoresist mask 114 is formed by exposing a blanket photoresist layer to actuating radiation through a photomask with a pattern of the gate to be formed, and then developing the exposed photoresist.

In FIG. 1C, the gate 116 is formed by patterning the gate material layer 112 using the photoresist mask 114 as an etch mask. As shown in FIG. 1D, after the gate 116 is patterned by etching, the photoresist mask 114 is removed. Subsequently, further processing to complete the semiconductor device is performed.

FIG. 2 is a top view of the structure of FIG. 1D with completed gate 116. The patterned gate material includes both the gate 116 and a wider region 118 of gate material for contacting to subsequent metallization, if desired.

SUMMARY OF THE INVENTION

According to an embodiment of the invention, there is provided a method for forming a small structure using spacers for definition of the structure. The method comprises a number of steps including: providing a sidewall template having a first sidewall region and a second sidewall region over a semiconductor substrate, forming a spacer layer comprising a spacer material over the sidewall template, performing a first etching of the spacer layer to remove a first region of the spacer layer over the first sidewall region while leaving a second region of the spacer layer over the second sidewall region, and performing a second etching of the spacer layer to form at least one sidewall spacer having a width, the at least one spacer adjacent the second sidewall region.

The first etching step may be performed, for example, using a break mask, where the exposed first region of the spacer layer is etched through the break mask.

BRIEF DESCRIPTION OF THE DRAWINGS

These and other advantages of the present invention will become more fully apparent from the following detailed description when read in conjunction with the accompanying drawings with like reference numerals indicating corresponding parts throughout, wherein.

DETAILED DESCRIPTION OF THE PREFERRED EMBODIMENTS

The present inventors have realized that it would be possible to form features, such as gates, with small widths using sidewall spacers for defining the structure of the features. Specifically, the sidewall spacers are formed from a material adjacent a sidewall of a sidewall template structure. Prior to forming the sidewall spacers, some of the material that is adjacent to a portion of the sidewall is removed. A variety of sidewall template structure shapes can be employed. Likewise, the sidewall spacer material can be varied. Thus, a large variety of shapes of the sidewall spacer structure can be readily achieved. Furthermore, the sidewall spacer structure is created in a second etch where structures wider than the sidewall spacers can simultaneously be formed. Thus, a structure including both wider regions and regions with the width of the sidewall spacer can be formed during the second etch.

Figure 1A:
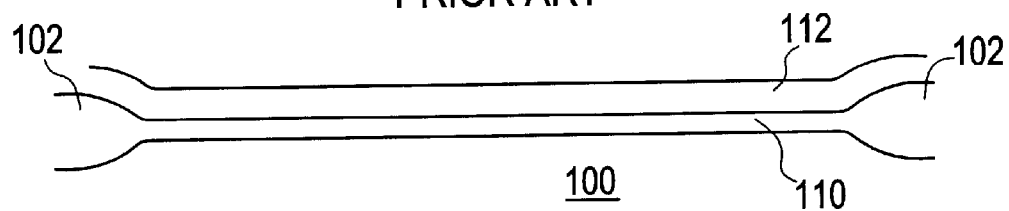
FIGS. 1A–1D illustrate side cross-sectional views of a semiconductor device formed according to a conventional method of forming a gate.
Figure 1B:
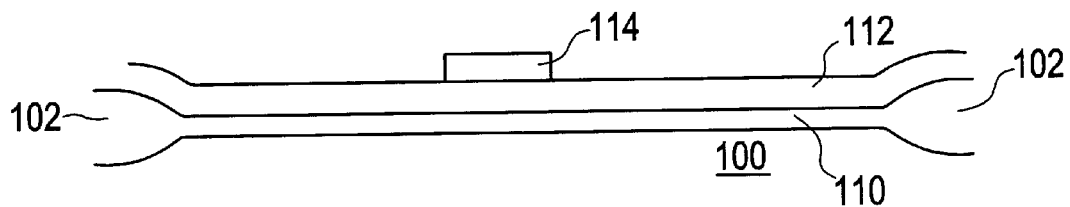
Figure 1C:
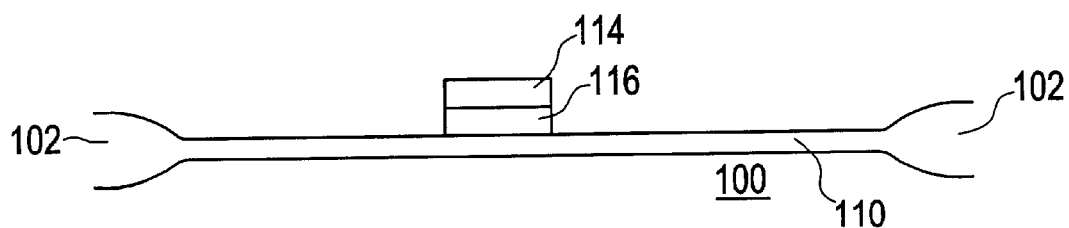
Figure 1D:
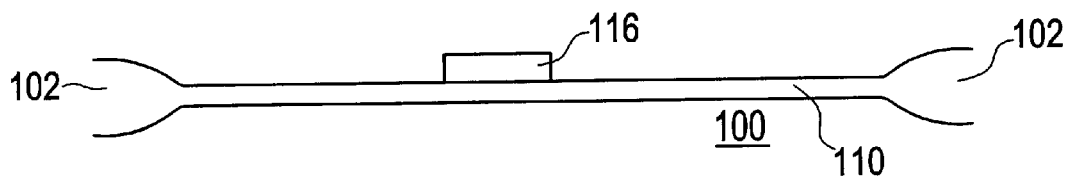
Figure 2:
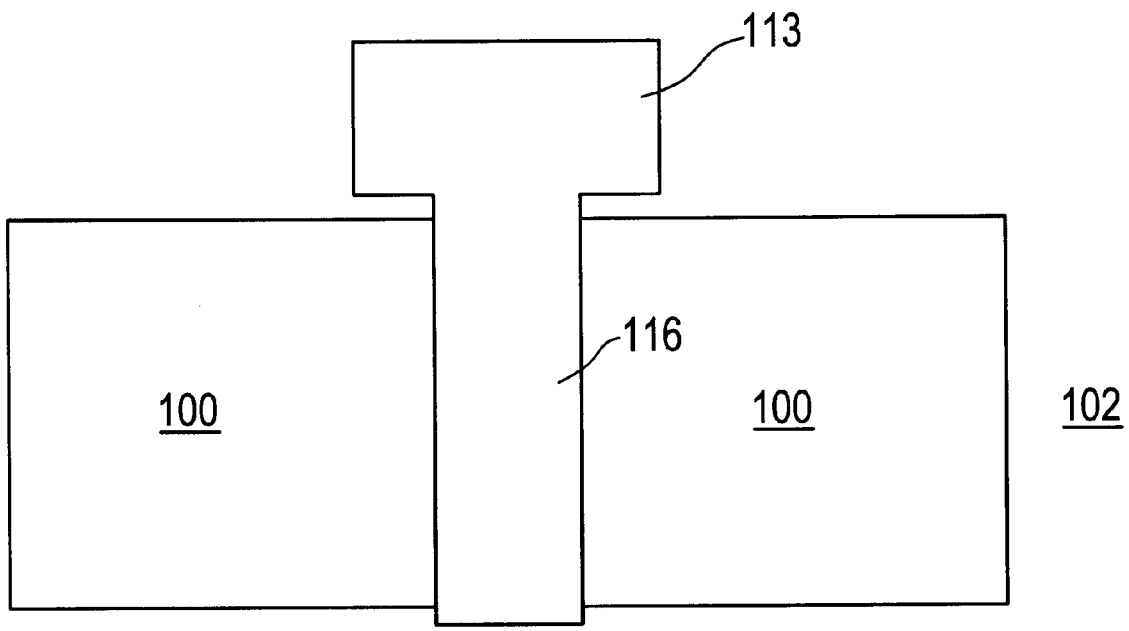
FIG. 2 illustrates a top view of the structure of FIG. 1D.
Figure 3A:
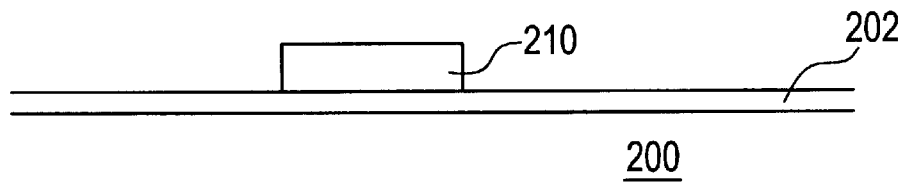
FIGS. 3A–3G illustrate side cross-sectional views of a semiconductor device according to an embodiment of a method of the present invention

FIGS. 3A–3G illustrate a method according to a first embodiment of the invention. FIG. 3A illustrates initial steps in a method of forming a semiconductor device. A sidewall template 210 comprising sidewall template material is formed over the semiconductor substrate 200. An underlying layer 202, which may include sublayers, may be formed prior to forming the sidewall template 210 depending on the device to be ultimately formed.

The sidewall template material may be formed by conventional techniques. For example, the sidewall template material may be formed by chemical vapor deposititition (CVD), plasma enhanced chemical vapor deposition (PECVD), sputtering, or evaporation. If the sidewall template material is formed by a blanket deposition technique, the sidewall template 210 may then be formed by patterning the sidewall template material using conventional photolithograhic techniques, for example.

Alternatively, the sidewall template 210 may be formed by selectively depositing the sidewall template material. In this case, it may be desired to form a region of nucleation material prior to depositing the sidewall template material so that the sidewall template material deposits selectively upon the nucleation material.

The sidewall template material may be, for example, an oxide such as silicon oxide or silicon dioxide, a nitride such as silicon nitride or a polymer such as resist material. The particular sidewall template material used will depend, in part, upon whether the sidewall template material is to be ultimately removed or is to be left as part of the device. For example, if the sidewall template material is to be ultimately removed, it may be desirable to form the sidewall template material of a resist material which may be easily removed by ashing.

Figure 4A:
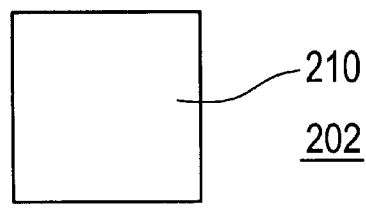
FIGS. 4A–4F illustrate top views of the structures illustrated in FIGS. 3A–3G.

FIG. 4A shows a top view of the sidewall template 210 on the substrate 200. Although FIGS. 3A and 4A show the sidewall template to have rectangular cross-sections, the sidewall template 210 may have other shapes. For example, the top surface (and bottom surface) of the sidewall template 210 may have a triangular or circular shape. Furthermore, the sidewall template need not have a uniform height, but may have a greater height in some regions than in other regions. In any case the sidewall template 210 has sidewalls.

Figure 3B:
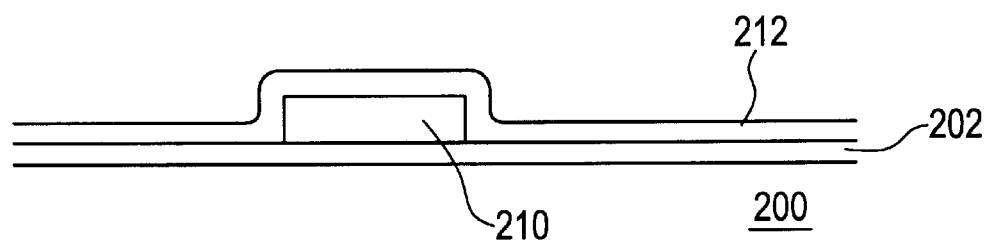

Now referring to FIG. 3B, a spacer layer 212 comprising a spacer material is formed over the sidewall template 210. The spacer layer 212 will ultimately be formed into structures including regions having the width of sidewall spacers. Prior to the sidewall template layer 210 being formed, the underlying 202 may optionally be formed. For example, if the structure to be formed from the spacer layer 212 is a gate, the underlying layer 202 may comprise a gate insulating layer such as an oxide or a nitride. For example, if the spacer layer 212 is to be formed into a gate, the underlying layer 202 may be silicon dioxide.

Figure 4B:
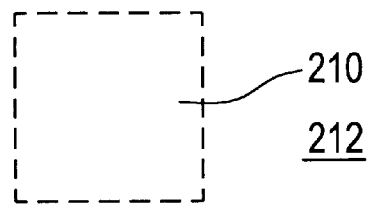

The spacer layer 212 may be formed by conventional deposition techniques such as CVD, PECVD, sputtering, or evaporation. If the spacer layer 212 is to be ultimately formed into a gate, the spacer layer 212 may be formed of a material comprising, for example, silicon, such as polysilicon or amorphous silicon. If the spacer layer 212 is to be formed into a gate comprising polysilicon, the spacer layer 212 may also comprise sublayers to reduce the sheet resistance of the spacer layer, or to act as a diffusion barrier layer. For example, the sublayers of the gate may be refractory metals, refractory metal silicides or refractory metal nitrides. Examples of appropriate sublayers include titanium, tungsten, titanium silicide, cobalt silicide, tungsten silicide, titanium nitride and tungsten nitride. FIG. 4B shows a top view of the structure of FIG. 3B. The portion of the spacer template 210 that is under another layer is shown by the dashed lines. In FIG. 4B all of the spacer template 210 is under another layer.

Figure 3C:
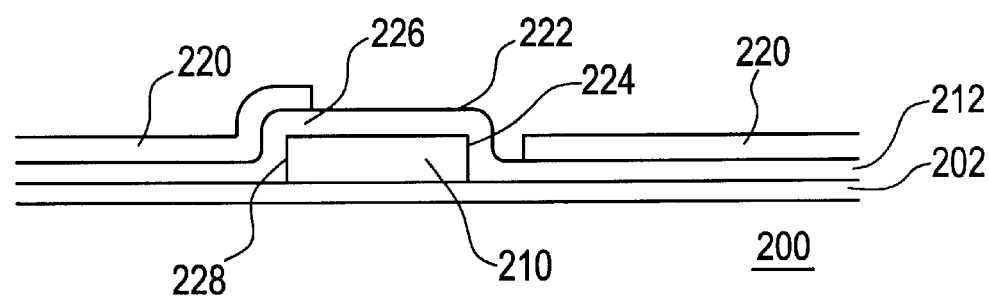

FIG. 3C shows a break mask 220 formed on the spacer layer 212. The break mask 220 exposes a first region 222 of the spacer layer where the first region 222 is over a first sidewall region 224 of the sidewall template 210. The break mask 220 shields a second region 226 of the spacer layer 212 that is over a second sidewall region 228 of patterned sidewall template layer 210.

The break mask 220 may be formed, for example, of photoresist. The break mask 220 may be formed, for example, by spinning on the photoresist, selectively exposing the photoresist to actuating light through a photomask, and developing the photoresist. Techniques of forming photoresist masks are known in the art.

After the break mask 220 is formed, the regions of the spacer layer 212 which are exposed by the break mask 220 may be removed by etching the spacer layer 212 through an aperture 221 of the break mask 220. Either an isotropic etch or an anisotropic etch may be used. Thus, either a wet or dry etch is appropriate. In this first etching of the spacer layer 212, the first region 222 of the spacer layer 212 is etched away.

Figure 4C:
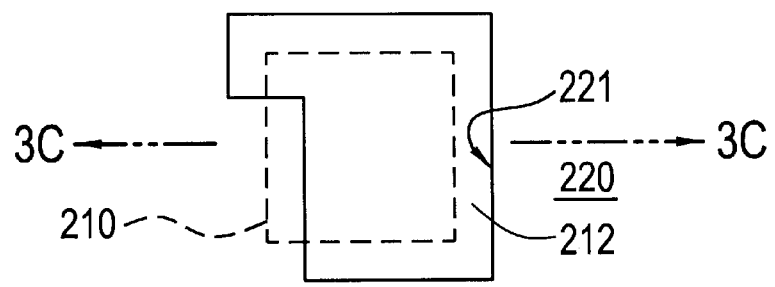

After the first etching the only region of the spacer layer 212 which remains adjacent the sidewall of the sidewall template 210 is the second region 226. Thus, only the second region 226 comprising the spacer material will ultimately form sidewall spacers. FIG. 4C shows a top view of the structure of FIG. 3C where the spacer layer 212 is exposed through aperture 221, but the spacer template 210 remains under spacer layer 212. FIG. 3C is a sideview of FIG. 4C along the line 3C—3C.

Figure 3D:
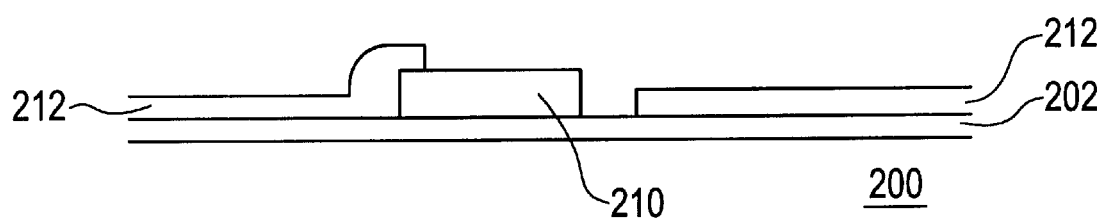
Figure 4D:
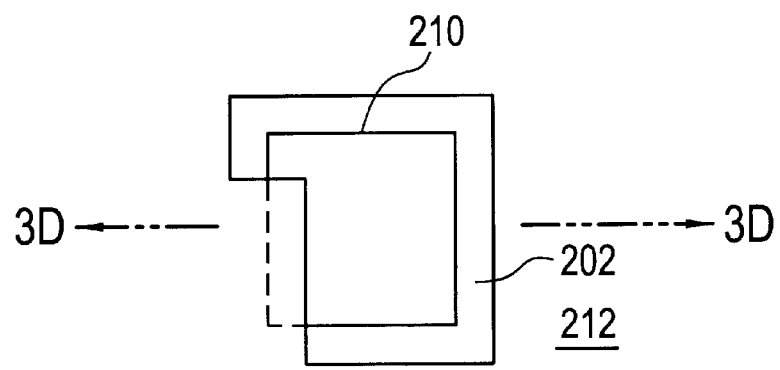

After the first etching, the break mask 220 is removed as shown in FIG. 3D. FIG. 4D shows a top view of the structure of FIG. 3D where a portion of the spacer template 210 and underlying Sayer 202 are exposed. FIG. 3D is a sideview of FIG. 4D along the line 3D—3D.

Figure 3E:
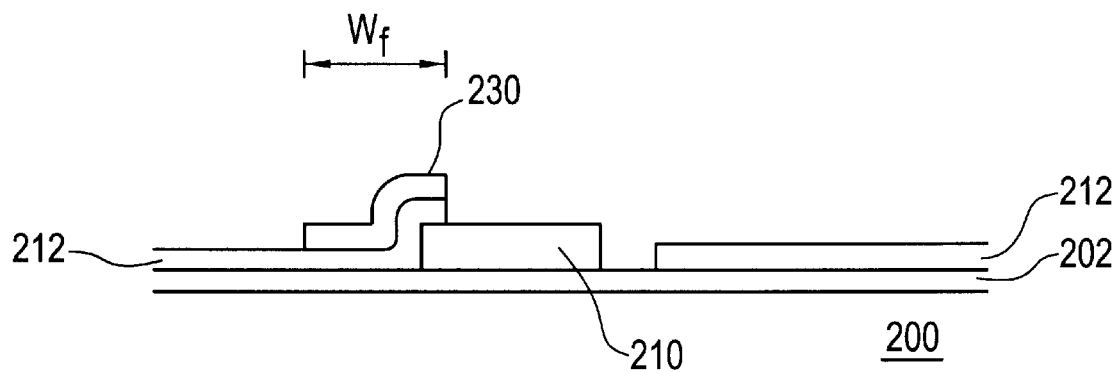
Figure 3F:
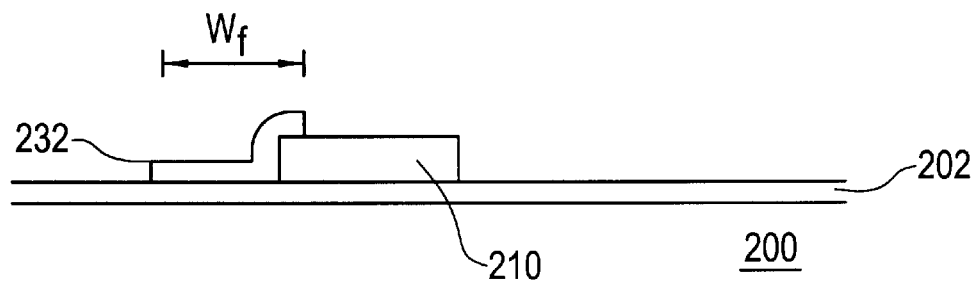
Figure 4E:
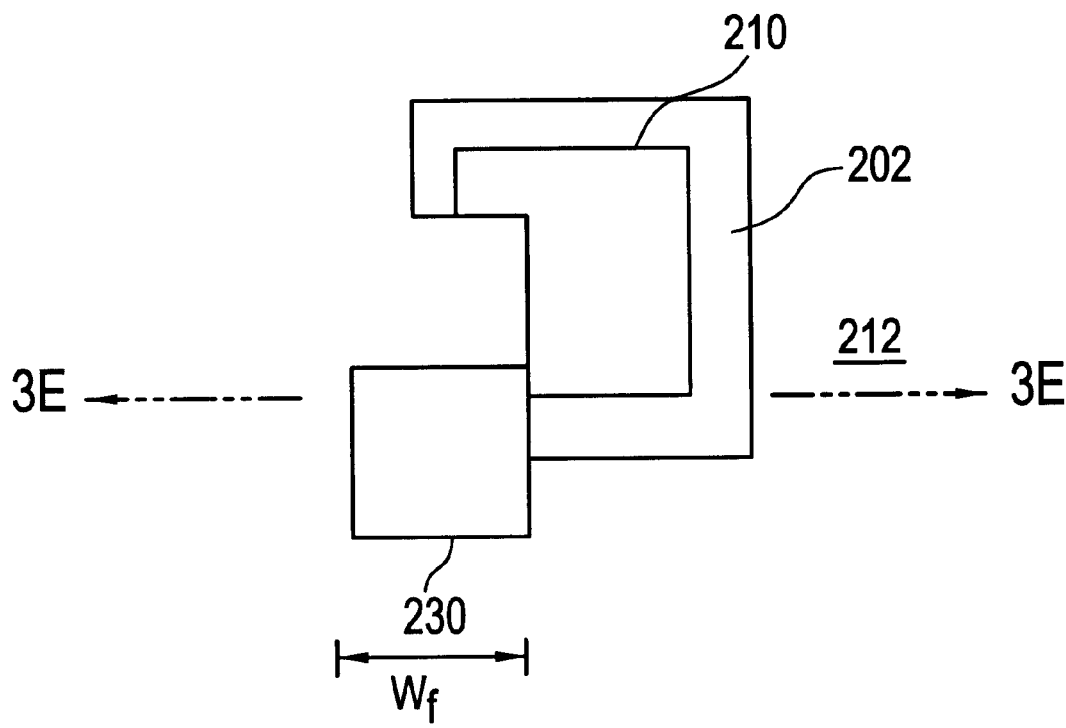

FIG. 3E illustrates steps in the embodiment of the method of the present invention where a field region comprising the spacer material is patterned while a sidewall spacer of the spacer material is also formed as described below. A field region mask 230 is formed on the spacer layer 212. The width of the field region mask 230 is shown as Wf in FIG. 3E. FIG. 4E shows a top view of the structure of FIG. 3E. FIG. 3E is a sideview of FIG. 4C along the line 3E—3E. The spacer layer 212 is then etched in a second etch using the field region mask 230 as an etch mask and the field region mask 230 may then be removed resulting in the structure shown in FIG. 3F. FIG. 3F shows a field region 232 of the spacer layer 212 with a width $W_f$. The second etch should be performed for a sufficient time to remove regions of the spacer layer except for the regions under the field region mask and the second region of the spacer layer 212.

Figure 4F:
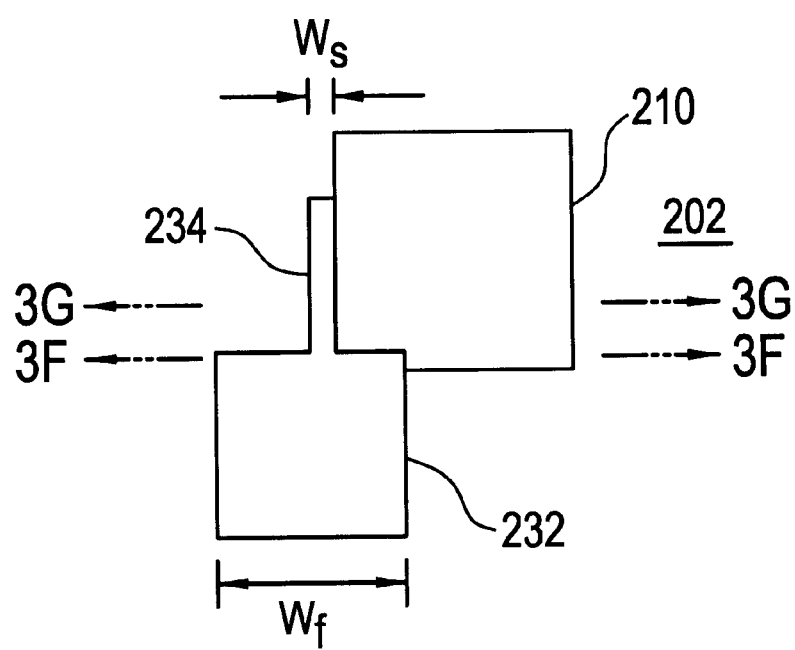

FIG. 4F is a top view of the structure of FIG. 3F. Conversely, FIG. 3F shows a side view of the structure of FIG. 4F along the line 3F—3F. As can be seen in FIG. 4F, when the spacer layer 212 is etched in the second etch, not only the field region 232 of the spacer material remains, but also a sidewall spacer 234. In order that sidewall spacer 34 is formed, it is preferable that the second etch be an anisotropic etch, such as a reactive ion etch (RIE). The sidewall spacer 234 has a width $W_s$. The field region 232 contacts the sidewall spacer 234 creating an overall structure with a width of the sidewall spacer of $W_s$ over one part of the structure and the width of the field region of $W_f$ over another part of the structure, where $W_f > W_s$. Thus the present invention, as embodied in this first embodiment, allows the definition of structures where at least a portion of the structure has a width of only a sidewall spacer.

The sidewall spacer 234 may be used as a gate, for example, while the field region 232 may be used as a contact region of the gate to be contacted by subsequently formed metallization.

Figure 3G:
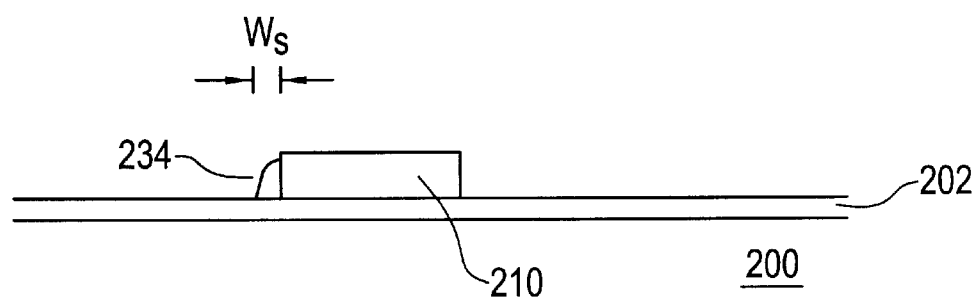

FIG. 3G is a sideview of the structure of FIG. 4F along the line 3G—3G. The sidewall spacer 234 with width $W_s$ can be seen in this side view alongside the sidewall template 210.

In this first embodiment a field region mask was used to create a structure with a field region with a width larger than that of the sidewall spacer of the structure. Alternatively, no field region mask may be formed, and the second etch will then form a spacer layer comprising only a sidewall spacer. Also, although FIG. 4F shows the field region contacting the sidewall spacer, the field region may instead not contact the sidewall spacer, but may be separate from the sidewall spacer. Provided that the spacer material is formed over the sidewall template 210 with good step coverage, the width of the sidewall spacer will depend in large part on the thickness of the spacer material. In general, a thicker spacer layer will result in a sidewall spacer with a greater width $W_s$. Thus, provided the step coverage of the spacer layer remains good for thinner layers, the sidewall spacer width $W_s$ can be controlled to be quite small. For example, the width $W_s$ may be less than approximately 100 Å or may be less than approximately 50 Å as desired. In practice, the width $W_s$ may be as large as several hundred Å, for example approximately 500 Å, or may be only approximately 50 Å.

In the first embodiment the sidewall spacer 234 as shown in FIG. 4F of the spacer layer 212 had the shape of a straight line. Alternatively, in the first etch, portions of the spacer material may be removed such that when the second etch is performed spacer material is formed around a corner of the sidewall template 210. The sidewall spacer thus formed will not be shaped as a straight line. Instead, one portion of the sidewall spacer will travel in a direction perpendicular to another portion of the sidewall spacer, assuming that the sidewall template 210 is shaped with 90° angles.

It is anticipated that the sidewall template 210 may be shaped such that its top surface has other than a rectangular shape. For example, the top surface may have a circular or triangular shape. In this case the sidewall spacer thus formed may travel in an arc of a circle, or may form an angle other than 90°, respectively.

In FIGS. 3A–3G and 4A–4F, each of the field regions 232 contacts a respective sidewall spacer 234. Alternatively, some field regions may be formed that do not contact respective sidewall spacers 234. For example, if the sidewall spacers 234 are to be narrow gates, the wider field regions not contacting a respective sidewall spacer 234 may be wide gates, or may define electrical "routing" connectors.

In FIGS. 3A–3G and 4A–4F, the layer 212 is patterned to form field region 232 and sidewall spacer 234, but underlying layer 202 is not patterned using the patterned layer 212. Alternatively, field region 232 and sidewall spacer 234 may be used as an etch mask to pattern the underlying layer 202. If the patterned underlying layer 202 is to be used as a gate, the layer 202 should comprise an appropriate gate material, as is known in the art. As yet another alternative, the underlying layer 202 may be patterned using the field region 232 and spacer 234, and the patterned underlying layer 202 may then be used as a mask to further pattern layers (not shown) underlying the underlying layer 202.

FIGS. 5A–5E illustrate a method according to a second embodiment of the invention. The steps of forming the sidewall template 310, spacer layer 312 and break mask 320 over the substrate 300 and the underlying layer 302 are similar to that of the first embodiment and will not repeated here. However, in the second embodiment a field region of the spacer layer is formed where the field region comprises a first subregion of the field region and a second subregion of the field region, where the first and second subregions are not contiguous and both contact the same sidewall spacer of the spacer layer, as described below.

Figure 5A:
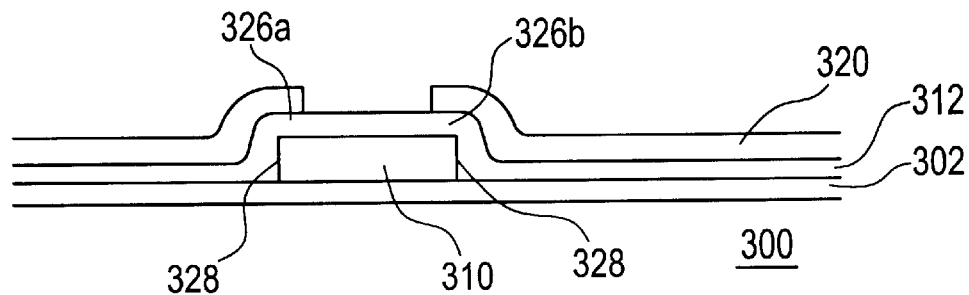
FIGS. 5A–5E illustrate side cross-sectional views of a semiconductor device according to another embodiment of a method of the present invention.

FIG. 5A corresponds to FIG. 3C of the first embodiment, i.e., the break mask 320 has been formed exposing the underlying spacer layer 312. A second region of the spacer layer 312 over a second sidewall region of the sidewall template 310 is shielded by the break mask 320. This second region comprises a first subregion 326a and a second subregion 326b that are not contiguous.

Figure 5B:
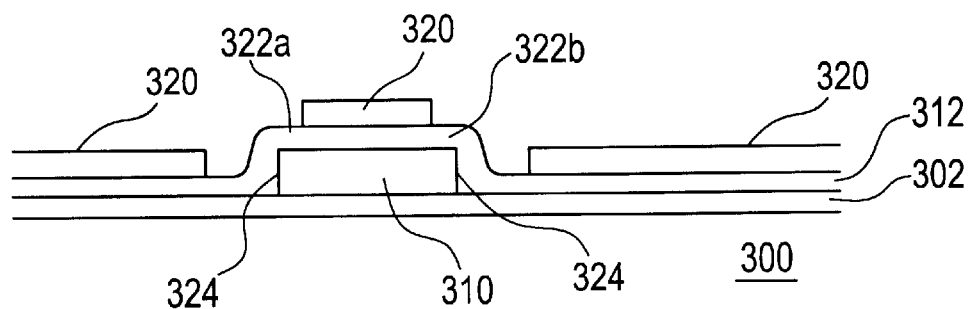
Figure 6A:
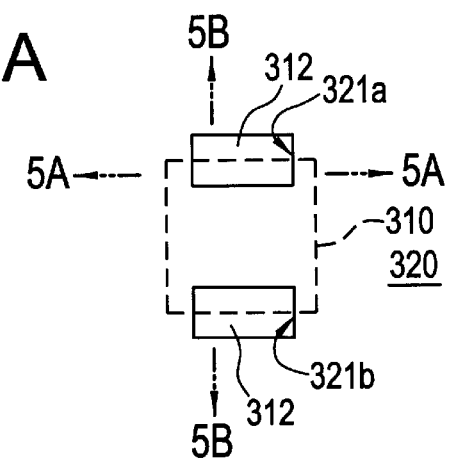
FIGS. 6A–6C illustrate top views of the structures illustrated in FIGS. 5A–5E.

FIG. 6A is a top view of the structure shown in FIG. 5A. As shown in FIG. 6A, the break mask 320 has two apertures 321a and 321b that expose two separated regions of the spacer layer 312. FIG. 5A is a side view of the structure of FIG. 6A along the line 5A—5A. FIG. 5B is a side view along line 5B—5B of FIG. 6A. As can be seen in FIG. 5B, the break mask 320 exposes a first region of the spacer layer 312 over a first sidewall region 324 of the sidewall template 310, where the first region includes a first subregion 322a and second subregion 322b that are not contiguous.

Figure 5C:
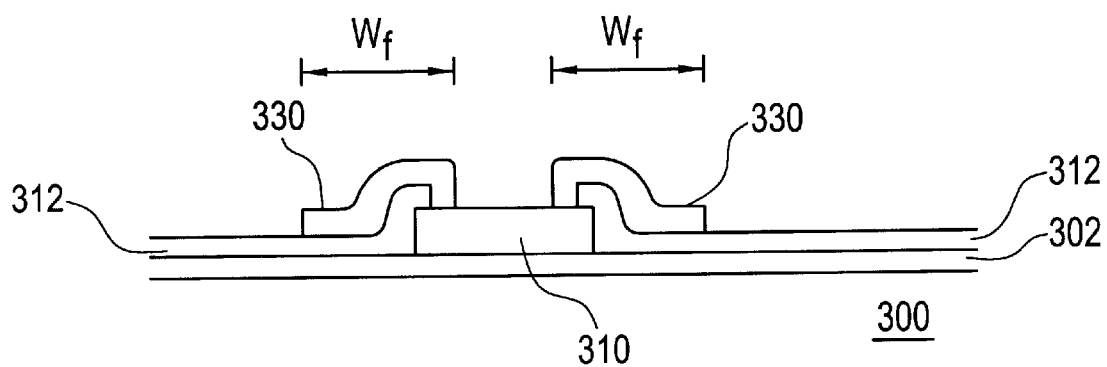

FIG. 5C illustrates further steps in the method of the second embodiment. After the break mask 320 is formed exposing the spacer layer 312, the spacer layer 312 is etched using the break mask 320 as an etch mask in a similar fashion to the first embodiment. Subsequently a field region mask 330 is formed over the spacer layer 312 as shown in FIG. 5C. The width of the field region mask is $W_f$ as shown.

Figure 6B:
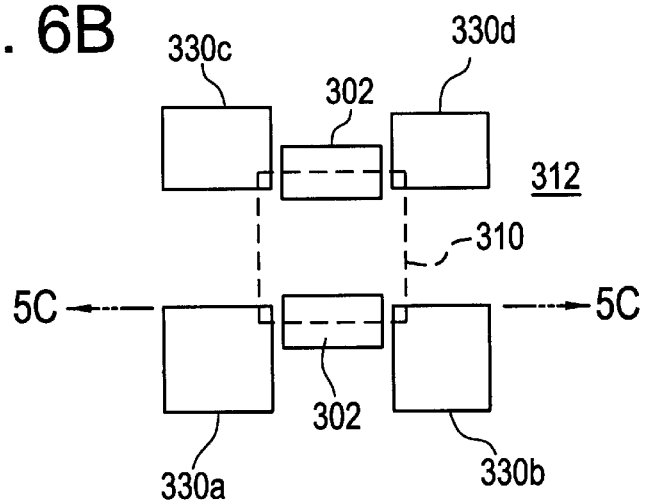

FIG. 6B is a top view of the structure of FIG. 5C. Conversely, FIG. 5C is a sideview of the structure of FIG. 6B along the line 5C—5C. In FIG. 6B it can be seen that the field region mask 330 is divided into four field region mask subregions, 330a, 330b, 330c and 330d. The field region mask subregions 330a and 330c are over respective opposing ends of the first spacer layer subregion 326a, while the field region mask subregions 330b and 330d are over respective opposing ends of the second spacer layer subregion 326b. The spacer layer 312 is then etched in a second etch using the field region mask 330 as an etch mask in a similar fashion as in the first embodiment.

Figure 5D:
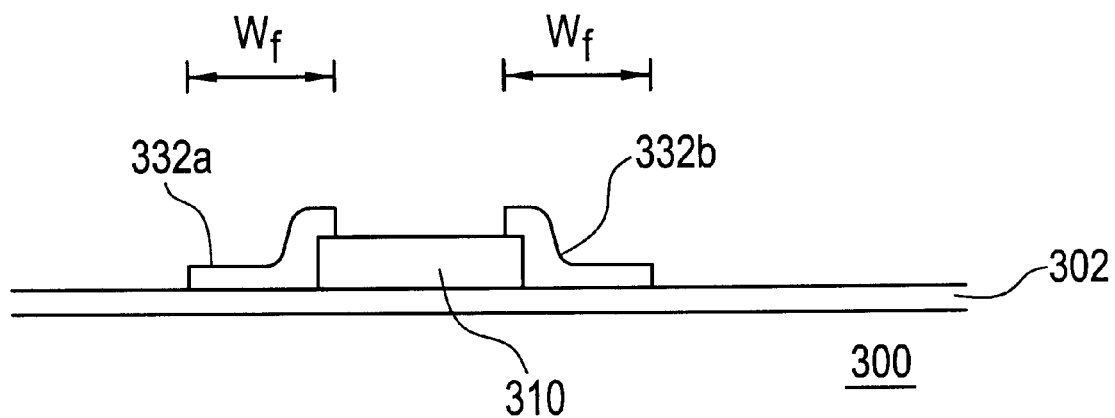
Figure 6C:
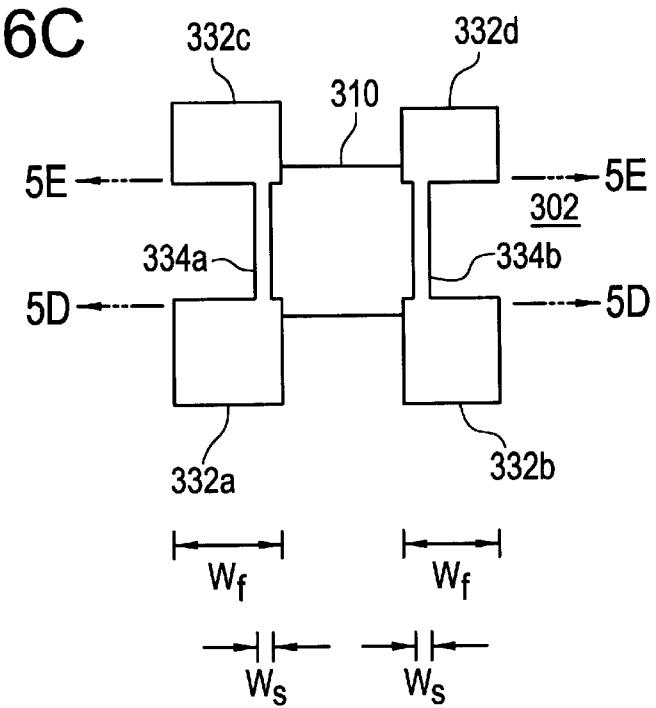

FIG. 5D shows the structure of the device after the second etch has been performed and the field region mask 330 has been removed. FIG. 6C is a top view of the structure of FIG. 5D where the underlying layer 302 and most of the patterned spacer template 310 are exposed. FIG. 5D is a side view of the structure of FIG. 6C along the line 5D—5D.

As shown in FIG. 6C, after the second etch has been performed, the at least one sidewall spacer 334 comprises sidewall spacers 334a and 334b. At this point the spacer layer 312 comprises, in addition to the sidewall spacers 334a and 334b, field region subregions 332a, 332b, 332c and 332d. The field region subregions 332a, 332b, 332c and 332d were formed during the second etch and were under the respective field region mask subregions 334a, 334b, 334c and 334d during that etch.

The field region subregions 332a and 332c contact opposing ends of the first sidewall spacer 334a, while the field region subregions 332b and 332d contact opposing ends of the second sidewall spacer 334b. The field region subregions 332a–332d have a width $W_f$ that is greater than the width $W_s$ of the spacers 334a and 334b.

Figure 5E:
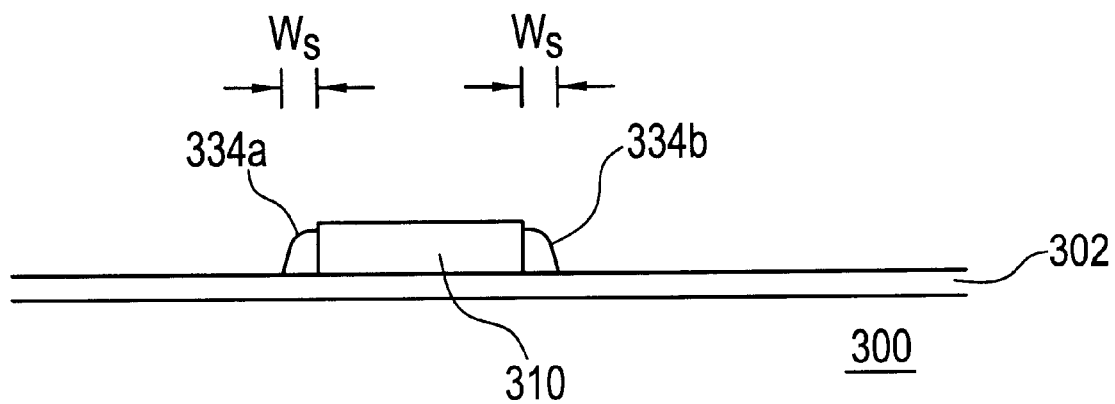

FIG. 5E is a side view of the structure of FIG. 6C along the line 5E—5E. FIG. 5E shows the two sidewall spacers 334a and 334b alongside the sidewall of the sidewall template 310.

As in FIGS. 3A–3G and 4A–4F, in FIGS. 5A–5E and 6A–6C, each of the field regions contacts a respective sidewall spacer. Alternatively, some field regions may be formed that do not contact respective sidewall spacers. The wider field regions not contacting a respective sidewall spacer may be wide gates, or may define electrical "routing" connectors, for example.

In a similar fashion to FIGS. 3A–3G and 4A–4F, in FIGS. 5A–5E and 6A–6C, the layer 312 is patterned to form field regions 332a–332d and sidewall spacers 334a and 334b, but underlying layer 302 is not patterned using the patterned layer 312. Alternatively, field regions 332a–332d and sidewall spacers 334a and 334b may be used as an etch mask to pattern the underlying layer 302. As yet another alternative, the underlying layer 302 may be patterned using the field regions 332a–332d and sidewall spacers 334a and 334b, and the patterned underlying layer 302 may then be used as a mask to further pattern layers (not shown) underlying the underlying layer 302.

FIGS. 7A–7D illustrate a method according to a third embodiment of the invention. In this embodiment the sidewall template 410 comprises a first sidewall template region 410a and a second sidewall template region 410b, where the regions 410a and 410b are not contiguous. In this third embodiment at least two sidewall spacers are formed, with at least one sidewall spacer being formed on the respective sidewalls of each of the first and second sidewall template regions 410a and 410b, as described below.

Figure 7A:
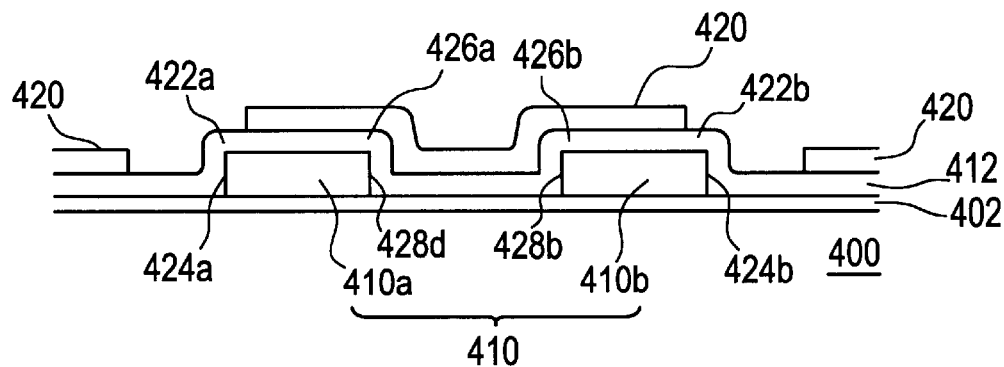
FIGS. 7A–7D illustrate side cross-sectional views of a semiconductor device according to another embodiment of a method of the present invention.

In a similar fashion to the first two embodiments, in this third embodiment, a sidewall template 410 is formed over an underlayer 402 and a substrate 400, a spacer layer 412 is formed over the sidewall template 410, and a break mask 420 is formed exposing a portion of the spacer layer 412. Such a structure with the break mask 420 exposing the spacer layer 412 is shown in FIG. 7A. In this third embodiment the sidewall template 410 comprises a first sidewall template region 410a and a second sidewall template region 410b where the regions are not contiguous. The sidewall template 410 is not exposed at this point as shown in FIG. 7A.

Figure 8A:
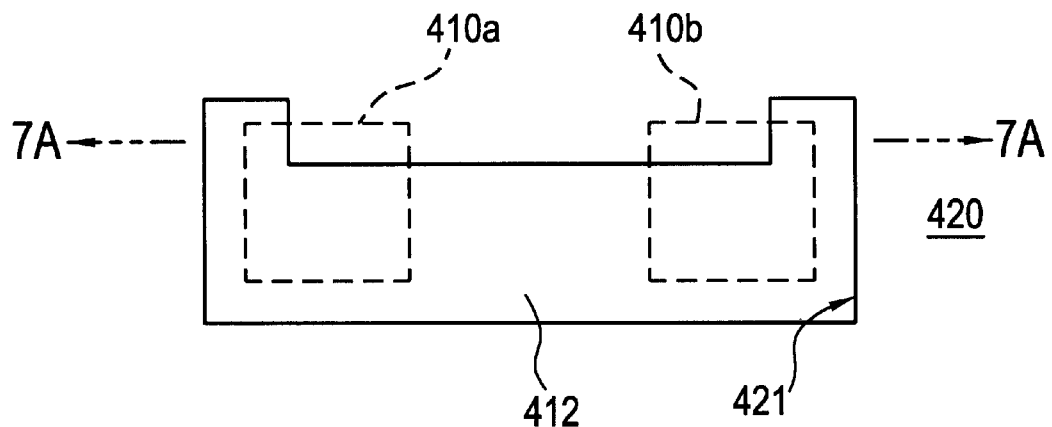
FIGS. 8A–8C illustrate top views of the structures illustrated in FIGS. 7A–7D.

FIG. 8A is a top view of the structure shown in FIG. 7A. Correspondingly, FIG. 7A is a side cross-sectional view of the structure of FIG. 8A along the line 7A—7A. As shown in FIG. 8A, the break mask 420 has an aperture 421 that exposes the spacer layer 412 over both the first sidewall template region 410a and the second sidewall template region 410b.

Referring again to FIG. 7A, the break mask 420 exposes the spacer layer 412 such that first regions 422a and 422b of the spacer layer 412, which are respectively over first sidewall regions 424a and 424b of the respective first sidewall template region 410a and the second sidewall template region 410b, are exposed. On the other hand, second regions 426a and 426b of the spacer layer 412, which are respectively over second sidewall regions 428a and 428b of the respective first sidewall template region 410a and the second sidewall template region 410b, are shielded by the break mask 420. A first etch is then performed to remove portions of the spacer layer 412 which are exposed by the break mask 420. These removed portions include the first regions 422a and 422b. Second regions 426a and 426b, which were shielded during the etch are not removed during the first etch.

Figure 7B:
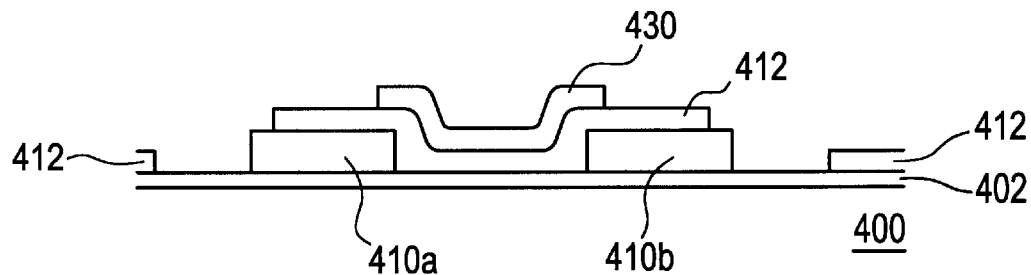
Figure 8B:
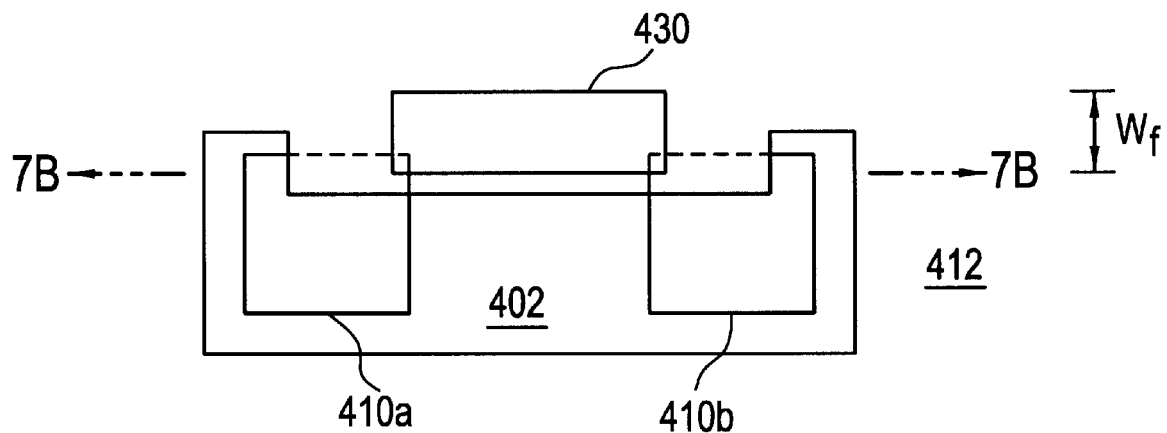

After the first etch is performed a field region mask 430 is formed over the spacer layer 412 as shown in FIG. 7B. As with the first and second embodiments, in this third embodiment the field region mask 430 may be a photoresist mask. FIG. 8B shows a top view of the structure of FIG. 7B. Conversely FIG. 7B is a side view of the structure of FIG. 8B along the line 7B—7B.

Referring again to FIG. 8B, the field region mask 430 has a width $W_f$. The field region mask 430 extends over both a portion of the second region 426a and the second region 426b adjacent the respective first and second sidewall template regions 410a and 410b. A second etch is then performed using the field region mask 430 as an etch mask as in the first two embodiments.

Figure 7C:
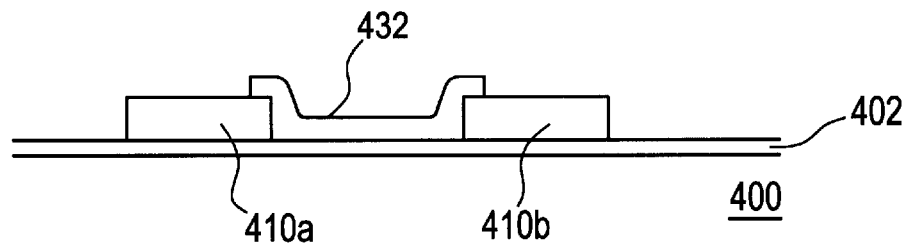
Figure 8C:
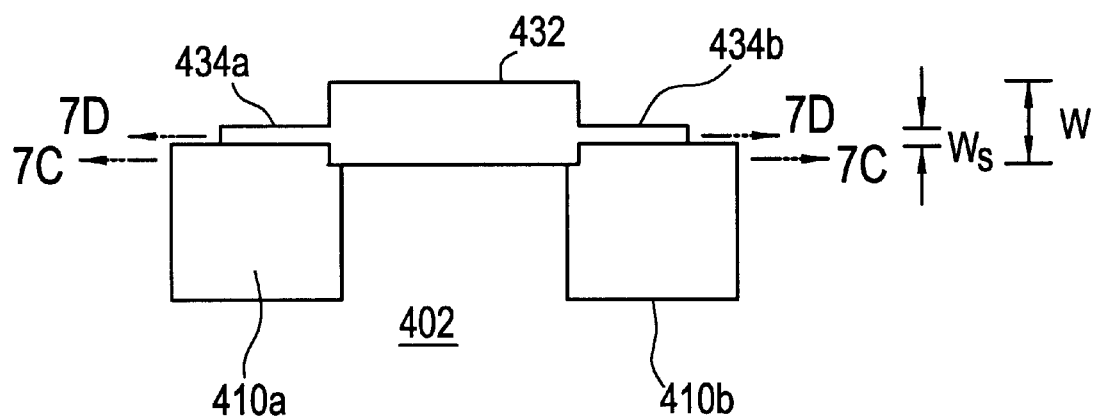

The field region mask 430 is then removed resulting in the structure shown in FIG. 7C. FIG. 8C is a top view of the structure of FIG. 7C. FIG. 7C is a side view of the structure of FIG. 8C along the line 7C—7C.

Referring again to FIG. 8C, the spacer layer 412 now comprises a first sidewall spacer 434a adjacent the first sidewall template region 410a and a second sidewall spacer 434b adjacent the second sidewall template region 410b. The spacer layer 412 also comprises a field region 432 that contacts both the first and second sidewall spacers 434a and 434b. The width $W_f$ of the field region 432 is greater than the width $W_s$ of the sidewall spacers 434a and 434b.

Figure 7D:
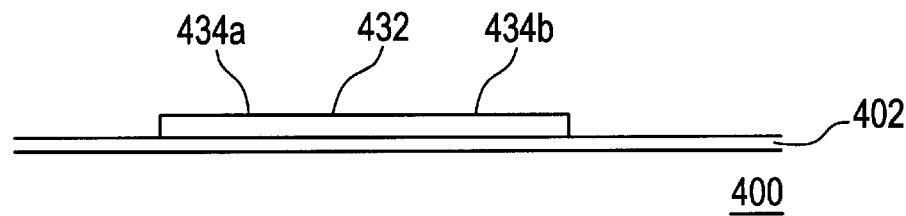

FIG. 7D is a side view of the structure of FIG. 8C along the line 7D—7D. The field region 432 can be seen contacting both the first and second sidewall spacers 434a and 434b.

After the second etch, the first and second sidewall template regions 410a and 410b can be removed if desired. Alternatively the sidewall template regions may remain and may be covered by an interlevel dielectric (ILD).

As in FIGS. 3A–3G and 4A–4F, in FIGS. 7A–7D and 8A–8C, each of the field regions contacts a respective sidewall spacer. Alternatively, some field regions may be formed that do not contact respective sidewall spacers. The wider field regions not contacting a respective sidewall spacer may be wide gates, or may define electrical "routing" connectors, for example.

In a similar fashion to FIGS. 3A–3G and 4A–4F, in FIGS. 7A–7D and 8A–8C, the layer 412 is patterned to form field region 432 and sidewall spacers 434a and 434b, but underlying layer 402 is not patterned using the patterned layer 412. Alternatively, field region 432 and sidewall spacers 434a and 434b may be used as an etch mask to pattern the underlying layer 402. As yet another alternative, the underlying layer 402 may be patterned using the field region 432 and sidewall spacers 434a and 434b, and the patterned underlying layer 402 may then be used as a mask to further pattern layers (not shown) underlying the underlying layer 402.

The methods as described above have significant advantages, especially in gate formation technology. Using the methods described here, one can fully define a gate with the added advantage of almost no limitation on how narrow the critical gate width is. Another advantage of the methods described above is that "field" or "wide poly" patterns can be connected to spacer patterns thus making the concept of making narrow gates practical and feasible.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A method of forming a semiconductor device comprising the steps of:
   providing a sidewall template having a first sidewall region and a second sidewall region over a semiconductor substrate;
   forming a spacer layer comprising a spacer material over the sidewall template;
   performing a first etching of the spacer layer to remove a first region of the spacer layer over the first sidewall region while leaving a second region of the spacer layer over the second sidewall region; and
   performing a second etching of the spacer layer to form at least one sidewall spacer having a width, the at least one sidewall spacer adjacent the second sidewall region.

2. The method of claim 1, wherein the width is less than 100 Å.

3. The method of claim 1, wherein the width is between 50 Å and 500 Å.

4. The method of claim 1, further comprising:
forming a break mask over the spacer layer exposing the first region of the spacer layer prior to the first etching step, wherein during the first etching step the exposed first region is etched through the break mask.

5. The method of claim 4, wherein the first etching step comprises an isotropic etch.

6. The method of claim 4, wherein the first etching step comprises an anisotropic etch.

7. The method of claim 4, wherein the break mask is a patterned photoresist mask.

8. The method of claim 1, further comprising the step of:
removing the sidewall template after the performing a second etching.

9. The method of claim 1, further comprising the step of:
forming an interlevel dielectric (ILD) over the spacer layer and the sidewall template after the second etching step.

10. The method of claim 1, wherein the providing a sidewall template step comprises:
forming sidewall template material over the semiconductor substrate; and
patterning the sidewall template material to form the sidewall template layer.

11. The method of claim 1, wherein the providing a patterned sidewall template step comprises:
selectively depositing sidewall template material to form the sidewall template.

12. The method of claim 1, wherein the sidewall template comprises one of an oxide, a nitride and a resist.

13. The method of claim 1, wherein the sidewall template comprises silicon dioxide.

14. The method of claim 1, wherein the step of forming a spacer layer comprises:
blanket depositing the spacer material.

15. The method of claim 1, wherein the forming a spacer layer step comprises:
depositing the spacer material by one of chemical vapor deposition, plasma enhanced chemical vapor deposition, sputtering, and evaporation.

16. The method of claim 1, wherein the spacer material comprises silicon.

17. The method of claim 16, wherein the spacer material comprises polysilicon.

18. The method of claim 17, wherein the spacer material further comprises a silicide or a nitride.

19. The method of claim 18, wherein the suicide comprises a refractory metal silicide.

20. The method of claim 19, wherein the silicide comprises one of titanium silicide, cobalt suicide and tungsten silicide.

21. The method of claim 1, wherein the second etching step patterns a field region of the spacer material adjacent and in contact with the at least one sidewall spacer, wherein the width of the at least one sidewall spacer is less than a width of the patterned field region.

22. The method of claim 1, further comprising the step of:
forming a gate insulating layer over the semiconductor substrate prior to forming the sidewall template, and wherein the at least one sidewall spacer forms a gate over the gate insulating layer.

23. The method of claim 21, further comprising the step of:
forming a gate insulating layer over the semiconductor substrate prior to forming the sidewall template, wherein the at least one sidewall spacer forms a gate over the gate insulating layer, and wherein the patterned field region forms a contact region.

24. The method of claim 21, wherein the patterned field region comprises a first field region subregion and a second field region subregion, the first field region subregion contacting a first end of the at least one sidewall spacer and the second field region subregion contacting a second end of the at least one sidewall spacer opposite to the first end.

25. The method of claim 21, wherein the at least one sidewall spacer comprises a first sidewall spacer and a second sidewall spacer, the first sidewall spacer contacting a first end of the field region and the second sidewall spacer contacting a second end of the field region opposite to the first end.

26. The method of claim 21, wherein the at least one sidewall spacer comprises a first sidewall spacer and a second sidewall spacer, the field region comprises a first field region subregion, a second field region subregion, a third field region subregion and a fourth field region subregion, the first and second field region subregions contacting respective opposite ends of the first sidewall spacer, the third and fourth field region subregions contacting respective opposite ends of the second sidewall spacer.

27. The method of claim 21, wherein the second etching step also patterns a second field region, wherein the patterned second field region does not contact any of the at least one sidewall spacer, and wherein the width of the at least one sidewall spacer is less than a width of the patterned second field region.

28. The method of claim 1, further comprising:
providing a first underlying layer over the semiconductor substrate prior to forming the sidewall template and the spacer layer;
removing the sidewall template; and
etching the first underlying layer using the at least one sidewall spacer as an etch mask to provide a patterned first underlying layer.

29. The method of claim 28, further comprising:
providing a second underlying layer over the semiconductor substrate prior to providing the first underlying layer; and
etching the second underlying layer using the patterned first underlying layer as an etch mask.

* * * * *